(12) United States Patent
Lee et al.

(10) Patent No.: US 8,890,336 B2
(45) Date of Patent: Nov. 18, 2014

(54) CYLINDRICAL BONDING STRUCTURE AND METHOD OF MANUFACTURE

(75) Inventors: Jin-Yuan Lee, Hsinchu (TW);
Chien-Kang Chou, Tainan Hsien (TW);
Shih-Hsiung Lin, Hsinchu (TW);
Hsi-Shan Kuo, Taipei (TW)

(73) Assignee: Qualcomm Incorporated, San Diego, CA (US)

( * ) Notice: Subject to any disclaimer, the term of this patent is extended or adjusted under 35 U.S.C. 154(b) by 871 days.

(21) Appl. No.: 12/132,628

(22) Filed: Jun. 4, 2008

(65) Prior Publication Data

US 2008/0296761 A1 Dec. 4, 2008

Related U.S. Application Data

(63) Continuation of application No. 10/055,580, filed on Jan. 22, 2002, now abandoned.

(30) Foreign Application Priority Data

Jan. 7, 2002 (TW) .............................. 91100092 A

(51) Int. Cl.
| | |
|---|---|
| *H01L 23/48* | (2006.01) |
| *H01L 25/00* | (2006.01) |
| *H01L 25/065* | (2006.01) |
| *H01L 23/00* | (2006.01) |

(52) U.S. Cl.
CPC ... *H01L 25/0657* (2013.01); *H01L 2924/01006* (2013.01); *H01L 2224/81191* (2013.01);
(Continued)

(58) Field of Classification Search
USPC .......................................... 257/737, 738, 778
See application file for complete search history.

(56) References Cited

U.S. PATENT DOCUMENTS

| | | |
|---|---|---|
| 3,893,156 A | 7/1975 | Riseman |
| 4,087,314 A | 5/1978 | George |

(Continued)

FOREIGN PATENT DOCUMENTS

| | | |
|---|---|---|
| EP | 1536469 | 6/2005 |
| JP | 58175839 | 10/1983 |

(Continued)

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

(Continued)

*Primary Examiner* — James Mitchell
(74) *Attorney, Agent, or Firm* — Seyfarth Shaw LLP

(57) ABSTRACT

A cylindrical bonding structure and its method of manufacture. The cylindrical bonding structure is formed over the bonding pad of a silicon chip and the chip is flipped over to connect with a substrate board in the process of forming a flip-chip package. The cylindrical bonding structure mainly includes a conductive cylinder and a solder block. The conductive cylinder is formed over the bonding pad of the silicon chip and the solder block is attached to the upper end of the conductive cylinder. The solder block has a melting point lower than the conductive cylinder. The solder block can be configured into a cylindrical, spherical or hemispherical shape. To fabricate the cylindrical bonding structure, a patterned mask layer having a plurality of openings that correspond in position to the bonding pads on the wafer is formed over a silicon wafer. Conductive material is deposited into the openings to form conductive cylinders and finally a solder block is attached to the end of each conductive cylinder.

20 Claims, 11 Drawing Sheets

(52) U.S. Cl.
CPC ....... *H01L 25/50* (2013.01); *H01L 2224/13111* (2013.01); *H01L 2224/11474* (2013.01); *H01L 2224/13144* (2013.01); *H01L 2224/16237* (2013.01); *H01L 2224/13155* (2013.01); *H01L 2924/01073* (2013.01); *H01L 2924/01078* (2013.01); *H01L 2924/14* (2013.01); *H01L 2224/13123* (2013.01); *H01L 2224/13609* (2013.01); *H01L 2224/05572* (2013.01); *H01L 2224/13139* (2013.01); *H01L 2224/13147* (2013.01); *H01L 2224/13118* (2013.01); *H01L 2224/16145* (2013.01); *H01L 2224/1147* (2013.01);*H01L 2924/01047* (2013.01); *H01L 2924/01023* (2013.01); *H01L 2924/01033* (2013.01); *H01L 2924/01029* (2013.01); *H01L 2924/01022* (2013.01); *H01L 2924/0103* (2013.01); *H01L 2924/01074* (2013.01); *H01L 2224/1312* (2013.01); *H01L 2924/01079* (2013.01); *H01L 2224/1308* (2013.01); *H01L 2924/01024* (2013.01); *H01L 2224/13083* (2013.01); *H01L 2224/11462* (2013.01); *H01L 2224/13109* (2013.01); *H01L 2924/04953* (2013.01); *H01L 2225/06513* (2013.01); *H01L 2924/01027* (2013.01); *H01L 2924/014* (2013.01); *H01L 2924/01049* (2013.01); *H01L 2224/13116* (2013.01); *H01L 2924/01046* (2013.01); *H01L 2924/00013* (2013.01); *H01L 2924/01012* (2013.01); *H01L 2924/10253* (2013.01); *H01L 2224/13099* (2013.01); *H01L 2924/01005* (2013.01); *H01L 2924/01082* (2013.01); *H01L 2924/01051* (2013.01); *H01L 24/13* (2013.01); *H01L 2224/13113* (2013.01); *H01L 24/11* (2013.01); *H01L 2224/11849* (2013.01)
USPC ............................ 257/778; 257/737; 257/738

(56) References Cited

U.S. PATENT DOCUMENTS

| | | | |
|---|---|---|---|
| 4,179,802 A | 12/1979 | Joshi | |
| 4,631,805 A * | 12/1986 | Olsen et al. | 438/123 |
| 4,652,336 A | 3/1987 | Andrascek | |
| 4,922,322 A * | 5/1990 | Mathew | 257/737 |
| 5,046,161 A | 9/1991 | Takada | |
| 5,061,985 A | 10/1991 | Meguro | |
| 5,071,518 A | 12/1991 | Pan | |
| 5,075,965 A * | 12/1991 | Carey et al. | 29/840 |
| 5,083,187 A | 1/1992 | Lamson | |
| 5,108,950 A | 4/1992 | Wakabayashi | |
| 5,130,779 A | 7/1992 | Agarwala et al. | |
| 5,132,775 A | 7/1992 | Brighton | |
| 5,134,460 A | 7/1992 | Brady | |
| 5,137,845 A | 8/1992 | Lochon | |
| 5,223,454 A | 6/1993 | Uda | |
| 5,226,232 A | 7/1993 | Boyd | |
| 5,244,833 A | 9/1993 | Gansauge et al. | |
| 5,251,806 A | 10/1993 | Agarwala et al. | |
| 5,261,155 A | 11/1993 | Angulas | |
| 5,261,593 A | 11/1993 | Casson et al. | |
| 5,268,072 A | 12/1993 | Agarwala | |
| 5,326,709 A | 7/1994 | Moon | |
| 5,418,186 A | 5/1995 | Park | |
| 5,439,162 A | 8/1995 | George et al. | |
| 5,448,114 A | 9/1995 | Kondoh et al. | |
| 5,466,635 A | 11/1995 | Lynch et al. | |
| 5,503,286 A | 4/1996 | Nye, III | |
| 5,508,561 A | 4/1996 | Tago et al. | |
| 5,521,438 A | 5/1996 | Okamoto et al. | |
| 5,531,021 A | 7/1996 | Kolman et al. | |
| 5,532,612 A | 7/1996 | Liang | |
| 5,541,135 A | 7/1996 | Pfeifer | |
| 5,554,940 A | 9/1996 | Hubacher | |
| 5,563,102 A | 10/1996 | Michael | |
| 5,565,379 A | 10/1996 | Baba | |
| 5,600,180 A | 2/1997 | Kusaka | |
| 5,631,499 A | 5/1997 | Hosomi | |
| 5,641,113 A | 6/1997 | Somaki et al. | |
| 5,641,990 A | 6/1997 | Chiu | |
| 5,656,858 A | 8/1997 | Kondo | |
| 5,656,863 A | 8/1997 | Yasunaga | |
| 5,664,642 A | 9/1997 | Williams | |
| 5,672,913 A | 9/1997 | Baldwin et al. | |
| 5,736,791 A | 4/1998 | Fujiki | |
| 5,740,787 A | 4/1998 | Ando | |
| 5,756,370 A | 5/1998 | Farnworth | |
| 5,767,010 A | 6/1998 | Mis | |
| 5,773,889 A * | 6/1998 | Love et al. | 257/737 |
| 5,783,865 A | 7/1998 | Higashiguchi et al. | |
| 5,795,818 A * | 8/1998 | Marrs | 438/612 |
| 5,796,591 A * | 8/1998 | Dalal et al. | 361/779 |
| 5,808,320 A | 9/1998 | Dennison | |
| 5,808,360 A | 9/1998 | Akram | |
| 5,854,513 A | 12/1998 | Kim | |
| 5,872,404 A | 2/1999 | Lynch et al. | |
| 5,873,512 A | 2/1999 | Bielick et al. | |
| 5,877,078 A | 3/1999 | Yanagida | |
| 5,883,435 A | 3/1999 | Geffken | |
| 5,889,326 A * | 3/1999 | Tanaka | 257/737 |
| 5,892,273 A | 4/1999 | Iwasaki | |
| 5,898,222 A | 4/1999 | Farooq | |
| 5,903,343 A | 5/1999 | Ning | |
| 5,943,597 A | 8/1999 | Kleffner | |
| 5,946,590 A | 8/1999 | Satoh | |
| 5,985,765 A | 11/1999 | Hsiao | |
| 6,011,314 A | 1/2000 | Leibovitz | |
| 6,013,571 A * | 1/2000 | Morrell | 438/612 |
| 6,016,013 A | 1/2000 | Baba | |
| 6,028,363 A | 2/2000 | Lin | |
| 6,042,953 A | 3/2000 | Yamaguchi | |
| 6,049,130 A * | 4/2000 | Hosomi et al. | 257/750 |
| 6,075,290 A | 6/2000 | Schaefer | |
| 6,077,726 A | 6/2000 | Mistry | |
| 6,085,968 A | 7/2000 | Swindlehurst | |
| 6,093,964 A | 7/2000 | Saitoh | |
| 6,103,551 A | 8/2000 | Ono et al. | |
| 6,127,735 A | 10/2000 | Berger et al. | |
| 6,136,047 A | 10/2000 | Karasawa | |
| 6,144,100 A | 11/2000 | Shen | |
| 6,144,102 A | 11/2000 | Amagai | |
| 6,162,652 A | 12/2000 | Dass | |
| 6,180,265 B1 | 1/2001 | Erickson | |
| 6,187,680 B1 | 2/2001 | Costrini | |
| 6,194,309 B1 | 2/2001 | Jin | |
| 6,196,443 B1 | 3/2001 | DiGiacomo | |
| 6,197,613 B1 | 3/2001 | Kung | |
| 6,198,169 B1 | 3/2001 | Kobayashi | |
| 6,198,619 B1 | 3/2001 | Fujioka | |
| 6,229,220 B1 | 5/2001 | Saitoh | |
| 6,229,711 B1 | 5/2001 | Yoneda | |
| 6,239,983 B1 | 5/2001 | Shingai | |
| 6,250,541 B1 | 6/2001 | Shangguan | |
| 6,251,704 B1 | 6/2001 | Ohuchi et al. | |
| 6,271,107 B1 | 8/2001 | Massingill | |
| 6,281,105 B1 | 8/2001 | Cotte et al. | |
| 6,281,106 B1 | 8/2001 | Higdon et al. | |
| 6,309,954 B1 | 10/2001 | Lake | |
| 6,319,830 B1 | 11/2001 | Yamaguchi | |
| 6,330,967 B1 | 12/2001 | Milewski et al. | |
| 6,332,988 B1 | 12/2001 | Berger, Jr. | |
| 6,336,262 B1 | 1/2002 | Dalal et al. | |
| 6,346,469 B1 | 2/2002 | Greer | |
| 6,350,632 B1 | 2/2002 | Lin | |
| 6,358,630 B1 | 3/2002 | Tsukada et al. | |
| 6,362,087 B1 | 3/2002 | Wang | |
| 6,372,622 B1 | 4/2002 | Tan | |
| 6,380,061 B1 | 4/2002 | Kobayashi | |
| 6,406,967 B1 | 6/2002 | Chung | |
| 6,413,851 B1 | 7/2002 | Chow et al. | |
| 6,424,037 B1 | 7/2002 | Ho et al. | |

(56) References Cited

U.S. PATENT DOCUMENTS

| | | | |
|---|---|---|---|
| 6,426,281 B1 | 7/2002 | Lin | |
| 6,426,556 B1 | 7/2002 | Lin | |
| 6,429,388 B1* | 8/2002 | Interrante et al. | 174/261 |
| 6,429,531 B1 | 8/2002 | Mistry | |
| 6,448,171 B1 | 9/2002 | Wang et al. | |
| 6,452,270 B1 | 9/2002 | Huang | |
| 6,455,785 B1 | 9/2002 | Sakurai et al. | |
| 6,459,150 B1* | 10/2002 | Wu et al. | 257/724 |
| 6,467,674 B1 | 10/2002 | Mihara | |
| 6,469,394 B1 | 10/2002 | Wong et al. | |
| 6,479,900 B1* | 11/2002 | Shinogi et al. | 257/758 |
| 6,492,197 B1 | 12/2002 | Rinne | |
| 6,492,737 B1 | 12/2002 | Imasu et al. | |
| 6,495,397 B2* | 12/2002 | Kubota et al. | 438/108 |
| 6,501,169 B1 | 12/2002 | Aoki | |
| 6,501,185 B1 | 12/2002 | Chow et al. | |
| 6,511,865 B1 | 1/2003 | Lin | |
| 6,518,092 B2 | 2/2003 | Kikuchi | |
| 6,518,096 B2* | 2/2003 | Chan et al. | 438/118 |
| 6,518,651 B2 | 2/2003 | Hashimoto | |
| 6,544,813 B1* | 4/2003 | Lin | 438/107 |
| 6,548,891 B2* | 4/2003 | Mashino | 257/700 |
| 6,552,436 B2 | 4/2003 | Burnette et al. | |
| 6,573,598 B2 | 6/2003 | Ohuchi | |
| 6,578,754 B1* | 6/2003 | Tung | 228/180.22 |
| 6,590,287 B2* | 7/2003 | Ohuchi | 257/738 |
| 6,592,019 B2 | 7/2003 | Tung | |
| 6,600,234 B2 | 7/2003 | Kuwabara | |
| 6,610,591 B1 | 8/2003 | Jiang et al. | |
| 6,627,988 B2 | 9/2003 | Andoh | |
| 6,638,847 B1 | 10/2003 | Cheung et al. | |
| 6,642,136 B1 | 11/2003 | Lee | |
| 6,653,563 B2 | 11/2003 | Bohr | |
| 6,661,100 B1 | 12/2003 | Anderson | |
| 6,681,982 B2* | 1/2004 | Tung | 228/197 |
| 6,683,380 B2 | 1/2004 | Efland | |
| 6,689,635 B1* | 2/2004 | Cobbley et al. | 438/106 |
| 6,706,554 B2* | 3/2004 | Ogura | 438/106 |
| 6,707,159 B1 | 3/2004 | Kumamoto | |
| 6,709,985 B1 | 3/2004 | Goruganthu | |
| 6,731,003 B2 | 5/2004 | Joshi | |
| 6,732,908 B2* | 5/2004 | Furman et al. | 228/180.22 |
| 6,732,913 B2 | 5/2004 | Alvarez | |
| 6,762,122 B2 | 7/2004 | Mis | |
| 6,784,087 B2 | 8/2004 | Lee et al. | |
| 6,809,020 B2 | 10/2004 | Sakurai | |
| 6,815,324 B2 | 11/2004 | Huang | |
| 6,818,545 B2 | 11/2004 | Lee | |
| 6,841,872 B1 | 1/2005 | Ha | |
| 6,847,118 B2* | 1/2005 | Milewski et al. | 257/738 |
| 6,853,076 B2 | 2/2005 | Datta | |
| 6,861,742 B2 | 3/2005 | Miyamoto | |
| 6,864,165 B1 | 3/2005 | Pogge | |
| 6,917,106 B2 | 7/2005 | Datta | |
| 6,917,119 B2 | 7/2005 | Lee | |
| 6,940,169 B2 | 9/2005 | Jin | |
| 6,940,178 B2 | 9/2005 | Kweon et al. | |
| 6,959,856 B2 | 11/2005 | Oh | |
| 6,963,136 B2 | 11/2005 | Shinozaki | |
| 6,977,435 B2 | 12/2005 | Kim | |
| 6,998,710 B2 | 2/2006 | Kobayashi | |
| 7,008,867 B2 | 3/2006 | Lei | |
| 7,034,402 B1 | 4/2006 | Seshan | |
| 7,071,573 B1 | 7/2006 | Lin | |
| 7,078,331 B2 | 7/2006 | Kwon | |
| 7,078,820 B2* | 7/2006 | Yanagida | 257/779 |
| 7,098,127 B2 | 8/2006 | Ito | |
| 7,109,118 B2 | 9/2006 | Cohen | |
| 7,135,766 B1 | 11/2006 | Costa | |
| 7,196,001 B2 | 3/2007 | Datta | |
| 7,199,036 B2 | 4/2007 | Chan | |
| 7,208,834 B2 | 4/2007 | Lee | |
| 7,220,657 B2 | 5/2007 | Ihara | |
| 7,246,432 B2 | 7/2007 | Tanaka | |
| 7,268,421 B1 | 9/2007 | Lin | |
| 7,271,483 B2 | 9/2007 | Lin | |
| 7,273,803 B2 | 9/2007 | Cheng | |
| 7,312,535 B2 | 12/2007 | Takewaki | |
| 7,315,085 B2* | 1/2008 | Liu | 257/773 |
| 7,323,406 B2 | 1/2008 | Lim | |
| 7,335,536 B2 | 2/2008 | Lange | |
| 7,338,890 B2 | 3/2008 | Lee | |
| 7,355,288 B2 | 4/2008 | Lee | |
| 7,456,089 B2 | 11/2008 | Aiba | |
| 7,462,942 B2 | 12/2008 | Tan | |
| 7,465,654 B2 | 12/2008 | Chou | |
| 7,476,564 B2 | 1/2009 | Chen et al. | |
| 7,479,690 B2 | 1/2009 | Shiraishi | |
| 7,700,475 B1 | 4/2010 | Kao et al. | |
| 7,713,782 B2 | 5/2010 | Pendse | |
| 7,754,598 B2 | 7/2010 | Lin et al. | |
| 7,781,325 B2 | 8/2010 | Lee et al. | |
| 7,800,239 B2 | 9/2010 | Dalal | |
| 7,846,830 B2 | 12/2010 | Takewaki | |
| 7,863,739 B2 | 1/2011 | Lee et al. | |
| 7,902,679 B2 | 3/2011 | Lin et al. | |
| 7,999,395 B1 | 8/2011 | Kao et al. | |
| 8,072,070 B2 | 12/2011 | Lee et al. | |
| 8,158,508 B2 | 4/2012 | Lin et al. | |
| 8,159,074 B2 | 4/2012 | Lin et al. | |
| 8,193,035 B2 | 6/2012 | Pendse | |
| 8,299,616 B2 | 10/2012 | Chuang et al. | |
| 2001/0026954 A1 | 10/2001 | Takao | |
| 2001/0027007 A1* | 10/2001 | Hosomi et al. | 438/611 |
| 2001/0040290 A1 | 11/2001 | Sakurai | |
| 2001/0042923 A1 | 11/2001 | Yanagida | |
| 2001/0048166 A1 | 12/2001 | Miyazaki | |
| 2001/0054771 A1 | 12/2001 | Wark et al. | |
| 2002/0033412 A1* | 3/2002 | Tung | 228/215 |
| 2002/0033525 A1 | 3/2002 | Ohuchi | |
| 2002/0043723 A1 | 4/2002 | Shimizu | |
| 2002/0053466 A1 | 5/2002 | Kusui | |
| 2002/0072215 A1* | 6/2002 | Furuya | 438/613 |
| 2002/0079575 A1 | 6/2002 | Hozoji et al. | |
| 2002/0095784 A1 | 7/2002 | Fang | |
| 2002/0100972 A1 | 8/2002 | Kitajima et al. | |
| 2002/0121692 A1* | 9/2002 | Lee et al. | 257/737 |
| 2002/0121709 A1* | 9/2002 | Matsuki et al. | 257/786 |
| 2002/0129894 A1* | 9/2002 | Liu et al. | 156/291 |
| 2002/0149118 A1 | 10/2002 | Yamaguchi et al. | |
| 2002/0173075 A1* | 11/2002 | Tie et al. | 438/108 |
| 2002/0180062 A1 | 12/2002 | Hsieh et al. | |
| 2003/0006062 A1 | 1/2003 | Stone | |
| 2003/0022477 A1* | 1/2003 | Hsieh et al. | 438/612 |
| 2003/0127734 A1 | 7/2003 | Lee | |
| 2003/0218246 A1 | 11/2003 | Abe | |
| 2003/0219966 A1 | 11/2003 | Jin et al. | |
| 2004/0007779 A1 | 1/2004 | Arbuthnot | |
| 2004/0032024 A1 | 2/2004 | Lee | |
| 2005/0026413 A1 | 2/2005 | Lee | |
| 2005/0032362 A1 | 2/2005 | Cohen | |
| 2006/0019490 A1 | 1/2006 | Chou | |
| 2006/0163729 A1 | 7/2006 | Lin | |
| 2006/0291029 A1 | 12/2006 | Lin | |
| 2006/0292851 A1 | 12/2006 | Lin | |
| 2007/0166993 A1 | 7/2007 | Lee | |
| 2009/0057894 A1 | 3/2009 | Chou | |
| 2009/0057895 A1 | 3/2009 | Lin | |
| 2009/0302468 A1* | 12/2009 | Baek et al. | 257/738 |
| 2009/0309224 A1 | 12/2009 | Lin | |
| 2011/0001250 A1* | 1/2011 | Lin et al. | 257/778 |
| 2011/0133334 A1 | 6/2011 | Pendse | |
| 2011/0215476 A1 | 9/2011 | Lee et al. | |
| 2012/0252168 A1 | 10/2012 | Nah et al. | |

FOREIGN PATENT DOCUMENTS

| | | |
|---|---|---|
| JP | 60217646 | 10/1985 |
| JP | 62-234352 | 10/1987 |
| JP | 1061038 | 3/1989 |
| JP | 02-177540 | 7/1990 |
| JP | 02177540 | 7/1990 |
| JP | 02237129 | 9/1990 |
| JP | 03004545 | 1/1991 |

(56) References Cited

FOREIGN PATENT DOCUMENTS

| JP | 04017390 | 1/1992 |
|---|---|---|
| JP | 4278543 | 10/1992 |
| JP | 4318935 | 11/1992 |
| JP | 05226544 | 9/1993 |
| JP | 07191641 | 7/1995 |
| JP | 1961221 | 8/1995 |
| JP | 1985660 | 10/1995 |
| JP | 8013166 | 1/1996 |
| JP | 08-172096 | 7/1996 |
| JP | 08172096 | 7/1996 |
| JP | 09045691 | 2/1997 |
| JP | 2785338 | 8/1998 |
| JP | 2000260803 | 9/2000 |
| JP | 2002016096 | 1/2002 |
| JP | 2002-26111 | 9/2002 |
| JP | 2002261111 | 9/2002 |
| JP | 2006128662 | 5/2006 |
| JP | 2006147810 | 6/2006 |
| JP | 3829325 | 10/2006 |
| JP | 3850261 | 11/2006 |
| JP | 3856304 | 12/2006 |
| TW | 447060 | 7/2001 |
| TW | 468246 | 12/2001 |
| TW | 471146 | 1/2002 |

OTHER PUBLICATIONS

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects On Power Supply Clamps," Proceedings of the 6th International Symposium on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

MEGIC Corp. "MEGIC way to system solutions through bumping and redistribution," (Brochure) (Feb. 6, 2004) pp. 1-3.

Lin, M.S. "Post Passivation Technology™—MEGIC® Way to System Solutions,"Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

Patent Abstract for "Solder Ball for Semiconductor Chip—Has Height Increased So That Stress Caused By Difference In Thermal Expansion Between Chip and Substrate is Minimised", Publication No. RD291011, Publication Date Jul. 10, 1988.

Periodic Table of the Elements, Sargent-Welch Scientific Company, Catalog No. S-18806, p. 1.

\* cited by examiner

CYLINDRICAL BONDING STRUCTURE AND METHOD OF MANUFACTURE

This application is a continuation of application Ser. No. 10/055,580, filed on Jan. 22, 2002, now pending.

CROSS-REFERENCE TO RELATED APPLICATION

This application claims the priority benefit of Taiwan application serial no. 91100092, filed Jan. 7, 2002.

BACKGROUND OF THE INVENTION

1. Field of Invention

The present invention relates to a cylindrical bonding structure and its method of manufacture. More particularly, the present invention relates to a cylindrical bonding structure for a flip chip package and a method of fabricating the cylindrical bonding structure.

2. Description of Related Art

In this information-saturated society, working with electronic products has become an integral part of our daily life. Currently, integrated circuit products are used for doing business, educating our children or providing us with games for recreation. As a result of rapid progress in electronic technologies, devices having powerfill functions and personalized designs have been developed. Moreover, most electronic products have light and compact design. Nowadays, high-density integrated circuits are frequently housed with in compact semiconductor packages such as a flip-chip package and a ball grid array (BGA) package.

In the flip-chip technique, bumps are formed on the bonding pads of a chip so that the bumps may be attached to corresponding contact points on a substrate after flip over. Compared with conventional wire bonding and tape automatic bonding (TAB) packaging techniques, a flip-chip package has the shortest signal transmission path between the chip and the substrate and hence has superior electrical properties. In addition, a flip-chip package may be designed to have its back exposed so as to increase heat dissipation rate. Due to the above reasons, flip-chip packaging techniques are widely adopted in the semiconductor fabrication industry.

FIG. 1A is a partially magnified view showing a connection configuration between a bump on a chip and a contact point on a substrate in a conventional flip-chip package. A chip 110 normally has a plurality of bonding pads 112 (only one is shown in FIG. 1A). Each bonding pad 112 has a bump 114. In general, the bump 114 is a solder bump so that the flip-over chip 110 may directly connect with one of the bonding pads 122 (only one is shown in FIG. 1A) on the substrate 120. Since the chip 110 and the substrate 120 each has a different coefficient of thermal expansion (CTE), a standoff distance must be provided between the chip 110 and the substrate 120 so that differential thermal expansion will not accumulate too much shear stress to break the bumps 114 prematurely.

Thus, to prevent shear stress from damaging the bumps 114, bumps 114 having a great height are often attached to the bonding pads 112 of the chip 110 so as to increase the distance of separation between the chip 110 and the substrate 120 as much as possible. However, increasing the overall height of the bumps 114 must be accompanied by a corresponding increase in outer diameter and volume of the bumps. Moreover, to prevent short-circuiting, pitch between neighboring bumps 114 must be increased. Ultimately, distance between neighboring bonding pads 112 on the chip 110 is hard to reduce.

In addition, pre-solder material is often applied on the junction pads 122 of the substrate 120 before the lower end of the bumps 114 are put against the pads 122. In a reflow operation, the low melting point pre-solder melts and joins the bumps 114 and the junction pads 122 together. Because an additional step of applying low melting point solder over the junction pads 122 of the substrate 120 has to be conducted, cost of fabricating the substrate 120 is increased Furthermore, to increase the distance of separation between the chip 110 and the substrate 120, high lead solder is a principle ingredient of the bumps 114. Since a high temperature treatment of the bump material to form a spherical shape bump often produces oxide material near the surface, the bumps 114 and the junction pads 122 often have poor adhesion after the solder reflow process. Poor adhesion often leads to bad electrical connections between the chip and the substrate and a low overall yield of the flip chip package.

FIG. 1B is a partially magnified view showing an alternative connective configuration between a bump on a chip and a contact point on a substrate in a conventional flip-chip package. A solder mask 124 is formed over the substrate 120 to pattern out contact area around the junction pads 122. In fact, there are two major patterning techniques that employ the solder mask 124. The first one is called a 'solder mask define' (SMD) and the other one is called a 'no solder mask define' (NSMD). In FIG. 1A, a 'solder mask define' (SMD) technique is used. An opening 126 in the solder mask 124 exposes a portion of the junction pad 122 so that a bump on the chip 110 is in a corresponding position over the junction pad 122 on the substrate 120. In FIG. 1B, a 'no solder mask define' (NSMD) technique is used. An opening 126 in the solder mask 124 completely exposes a junction pad 122 so that a bump is completely connected to the junction pad 122. The most commonly used material for forming the solder mask 124 is, for example, green lacquer.

To shorten pitch between neighboring junction pads 122, SMD technique such as the one shown in FIG. 1A is often employed. Only a portion of the junction pad 122 is exposed through the solder mask 124 for contact with the lower edge of a bump 114 (shown in profile by dash lines 114a). However, because actual dimension of a bump 114 may vary from the standard dimension by .+−.10%, variation in positional accuracy between the bump 114 and the junction pad 122 of up to 10 micrometers is possible. Furthermore, the opening 126 in the solder mask layer 124 may have an intrinsic diametrical variation of about 15 micrometers. Hence, when the bump 114 and the junction pad 122 are laid on top of each other, the lower edge of the bump 114 may not come into direct contact with the surface of the junction pad 122. In extreme cases, part of the outer edge of the bump 114 may lean upon the upper corner of the opening 126 of the solder mask layer 124 shown by the dash line 114b in FIG. 1A. Hence, after a solder reflow operation, the bump 114 may not be properly bonded with the junction pad 122 to form a good electrical connection. To ensure proper bonding between the lower edge of the bump 114 with the junction pad 122, diameter of the opening 126 of a conventional solder mask 124 is generally larger than the external diameter of the bump 114. Since distance between neighboring junction pads 122 must be increased to accommodate the extension, ultimate level of integration is greatly reduced.

SUMMARY OF THE INVENTION

Accordingly, one object of the present invention is to provide a cylindrical bonding structure and its method of manufacture capable of reducing the separation between neighboring bonding pads on a chip while increasing distance of separation between the chip and a substrate. Ultimately, reliability of the junctions connecting the chip and the substrate is improved and post-packaging life of the chip is extended.

A second object of this invention is to provide a cylindrical bonding structure and its method of manufacture capable of reducing the diameter of openings on a solder mask for exposing a junction pad so that distance of separation between neighboring junction pads on the substrate is reduced. Consequently, the distance of separation between neighboring bonding pads (bumps) on the chip is also reduced.

A third object of this invention is to provide a cylindrical bonding structure and its method of manufacture that requires no application of low melting point solder material on the junction pads of a substrate or the surface of bumps before conducting a reflow process. Thus, production cost of a flip-chip package is reduced.

To achieve these and other advantages and in accordance with the purpose of the invention, as embodied and broadly described herein, the invention provides a cylindrical bonding structure and its method of manufacture. A ball contact metallic layer is formed over the entire surface of a silicon wafer. A patterned mask layer is formed over the ball contact metallic layer. The mask layer has openings that correspond in position to bonding pads on the wafer and expose a portion of the underlying ball contact metallic layer. By conducting an electroplating process, for example, conductive material is deposited into the openings of the mask layer to form conductive cylinders. Through electroplating or printing, solder material is deposited into the openings of the mask layer to form a cylindrical solder cap on the upper surface of the conductive cylinders. The mask layer and the ball contact metallic layer outside the conductive cylinder are removed. The residual ball contact metallic layer, the conductive cylinder and the solder cap together form a cylindrical bonding structure. In addition, the cylindrical solder cap may undergo a reflow treatment to transform the cylindrical solder cap into a solder block attached to the upper surface of the conductive cylinder. Alternatively, the deposition of solder material into the openings may be deleted. After the formation of the conductive cylinders, the mask layer and the ball contact metallic layer outside the conductive cylinders are removed. Thereafter, a ball implant process is conducted to attach a solder ball directly onto the exposed surface of each conductive cylinder. The residual ball contact metallic contact, the conductive cylinder and the solder ball together form a cylinder bonding structure.

This invention also provides an alternative cylindrical bonding structure and its method of manufacture. A ball contact metallic layer is formed over the entire surface of a silicon wafer. A patterned first mask layer is formed over the ball contact metallic layer. The first mask layer has openings that correspond in position to bonding pads on the wafer and expose a portion of the underlying ball contact metallic layer. By conducting an electroplating process, for example, a conductive material is deposited into the openings of the mask layer to form a conductive cylinder. A patterned second mask layer is formed over the first mask layer. The second mask layer has openings that expose the upper surface of the conductive cylinders. Similarly, by conducting another electroplating operation, solder material is deposited into the openings of the mask layer to form cylindrical solder caps on the upper surface of all conductive cylinders. The first mask layer, the second mask layer and the ball contact metallic layer outside the conductive cylinder are removed. The residual ball contact metallic layer, the conductive cylinder and the cylindrical solder cap together form a cylindrical bonding structure. In addition, the cylindrical solder cap may be designed to have an outer diameter smaller than the diameter of the opening in the solder mask. Hence, the cylindrical solder cap may pass through the solder mask opening to contact the junction pad on the substrate when the chip is flipped over the substrate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
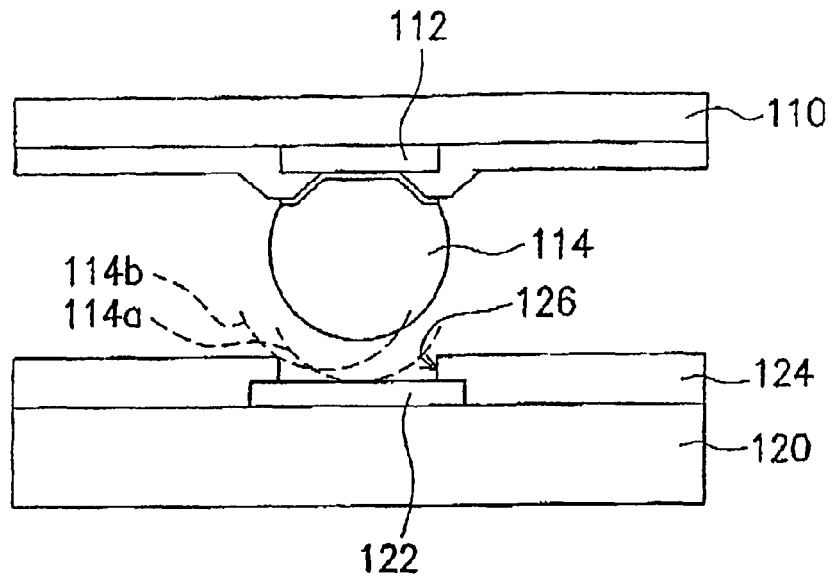
FIG. 1A is a partially magnified view showing a connection configuration between a bump on a chip and a contact point on a substrate in a conventional flip-chip package.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
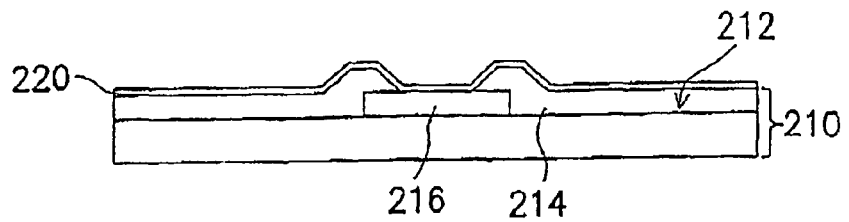
FIGS. 2A.about.2F are schematic cross-sectional views showing the progression of steps for producing a cylindrical bonding structure according to a first embodiment of this invention.

FIGS. 2A.about.2F are schematic cross-sectional views showing the progression of steps for producing a cylindrical bonding structure according to a first embodiment of this invention. As shown in FIG. 2A, a silicon wafer 210 is provided. Since each chip (not shown) is formed by cutting up the wafer 210 and any redistribution layer or bumps are formed before cutting, the wafer 210 actually represents a congregation of uncut chips. Furthermore, the active surface 212 of the wafer 210 has a passivation layer 214 and a plurality of bonding pads 216 (only one bonding pad is shown in FIG. 2A). The active surface 212 of the wafer 210 refers to the side of the wafer 210 where active devices are formed. The patterned passivation layer 214 exposes the bonding pads 216. Note that bonding pads 216 includes those original pads on the chips or the bonding pads of any redistribution circuit layer on the chips. The purpose of having a redistribution layer is to relocate the original bonding pads on the chip to some other places on the chip.

As shown in FIG. 2A, a ball contact metallic layer 220 is formed over the entire active surface 212 (that is, the passivation layer 214) of the wafer 210 by conducting, for example, an electroplating operation, an evaporation plating operation or sputtering. The ball contact metallic layer 220 covers the bonding pads 216 and serves as an interface between a subsequently formed conductive cylinder 240 (as shown in FIG. 2C) and the bonding pad 216. Hence, the ball contact metallic layer must be a material that produces as little stress as possible, has a high adhesive strength, resists corrosion and sticks to surface quite easily. In general, the ball contact metallic layer is a composite layer comprising two or more metallic layers, for example, including an adhesive layer and a wetting layer. Common metallic material for fabricating the ball contact metallic layer includes titanium (Ti), tungsten (W), chromium (Cr), copper (Cu), nickel (Ni), cobalt (Co), silver (Ag), gold (Au), tin (Sn), vanadium (V), palladium (Pd) or an alloy of some of the aforementioned metals.

Figure 2B:
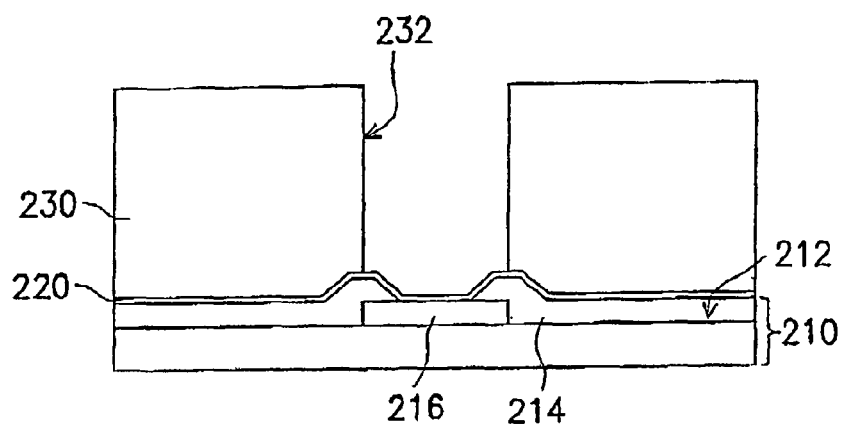
Figure 2C:
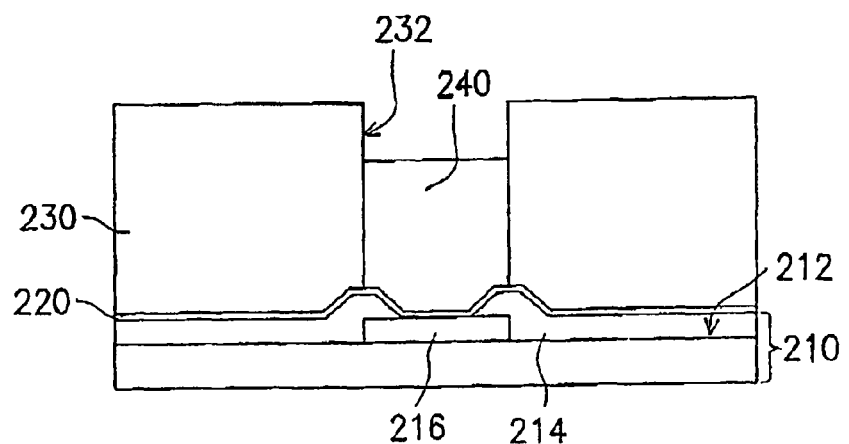

As shown in FIG. 2B, a patterned mask layer 230 is formed over the ball contact metallic layer 220. The mask layer 230 has a plurality of openings 232 (only one is shown in FIG. 2B) that corresponds in position to the bonding pads 216 and exposes a portion of the ball contact metallic layer 220. The patterned mask layer 230 is formed, for example, by forming a photoresist layer over the ball contact metallic layer 220, conducting a photographic exposure and developing the photoresist layer. Aside from depositing photoresist and conducting photographic procedures, the mask layer 230 with openings 232 thereon may also be formed by a corresponding method using some other materials.

As shown in FIG. 2C, an electroplating operation is conducted to deposit conductive material into the opening 232 using the ball contact metallic layer 220 as a seed layer. The opening 232 is partially filled to form a conductive cylinder 240 over the ball contact metallic layer 220. The conductive material deposited into the opening 232 is a high melting point metal or alloy such as tin (Sn), lead (Pb), copper (Cu), gold (Au), silver (Ag), zinc (Zn), bismuth (Bi), magnesium (Mg), antimony (Sb), indium (In) or an alloy containing various combination of the aforementioned metals.

Figure 2D:
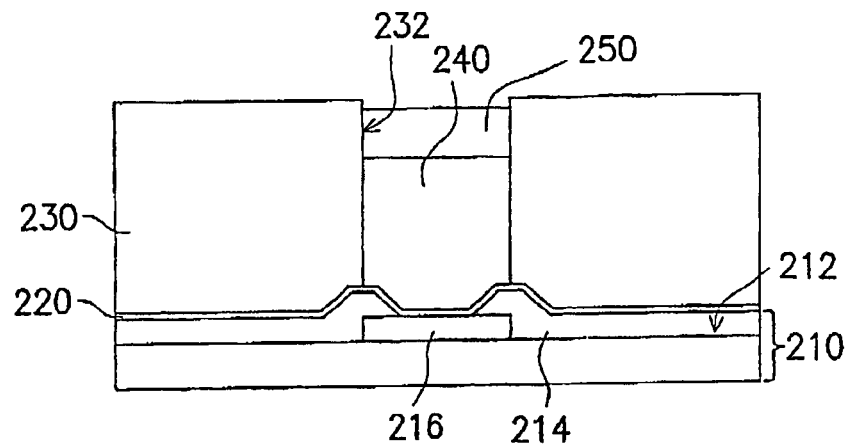

As shown in FIG. 2D, an electroplating operation or a printing operation is conducted to fill the remaining space of the opening 232 with solder material using the conductive cylinder 240 as a seed layer. The solder material forms a cylindrical solder cap 250 over upper surface of the conductive cylinder 240. Note that the solder material is a metal or alloy having a melting point lower than that of the conductive cylinder. Suitable solder material includes tin (Sn), lead (Pb), copper (Cu) gold (Au), zinc (Zn), bismuth (Bi), magnesium (Mg), antimony (Sb), indium (In) or an alloy containing various combinations of the aforementioned metals.

Figure 2E:
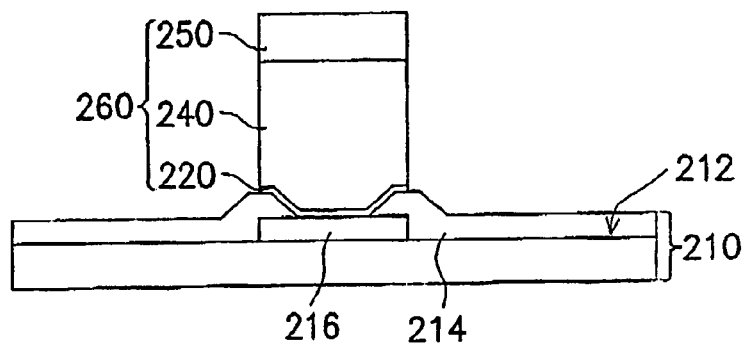

As shown in FIG. 2E, the mask layer 230 and the ball contact metallic layer 230 outside the conductive cylinder 240 are removed. The reserved ball contact metallic layer 220, the conductive cylinder 240 and the cylindrical solder cap together constitute a cylindrical bonding structure 260. As an example, the conductive cylinder 240 may contain tin and lead in the ratio 5:95 (5Sn/95Pb) or 10:90 (10Sn/90Pb) and the cylindrical solder cap 250 may contain tin and lead in the ratio 63:37 (63Sn/37Pb) or 60:40 (60Sn/40Pb). The conductive cylinder 240 can also be a copper rod while the cylindrical solder cap 250 can be a tin cap. Alternatively, the conductive cylinder 240 can be a rod made from a high melting point lead-free alloy such as a tin-silver-copper (Sn/Ag/Cu) alloy and the cylindrical solder cap 250 can be a cap made from a low melting point lead-free alloy such as tin-bismuth (Sn/Bi) alloy.

Figure 2F:
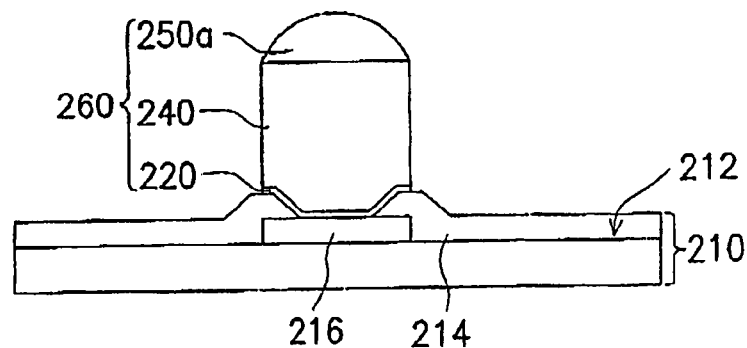

As shown in FIG. 2F, a reflow treatment is conducted after the cylindrical bonding structure 260 is exposed. In the reflow process, the cylindrical solder cap 250 is partially melted to form a solder block 250a having a hemispherical profile over the upper surface of the conductive cylinder 240.

Figure 1B:
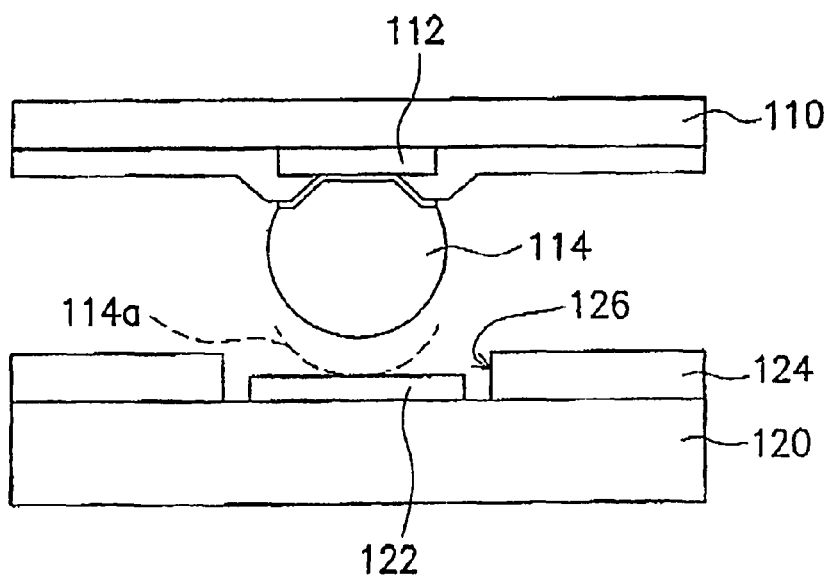
FIG. 1B is a partially magnified view showing an alternative connective configuration between a bump on a chip and a contact point on a substrate in a conventional flip-chip package.

As shown in FIGS. 2E and 2F, the cylindrical bonding structure 260 of the first embodiment mainly comprises the conductive cylinder 240 and the solder block 250a. The solder block may have a cylindrical shape (the cylindrical solder cap 250 shown in FIG. 2E) or a hemispherical shape (shown in FIG. 2F). The cylindrical bonding structure 260 serves a similar function as the bump 114 in FIGS. 1A and 1B. When the solder block 250a melts, the conductive cylinder 240 and the junction pad 122 are joined together. Hence, the cylindrical bonding structure 260 not only serves as a medium for connecting the chip 110 and the substrate 120 together electrically, the conductive cylinder 240 also serves as an cushioning pad from the chip 110 that pushes the solder block further towards the substrate 120. Note that outer diameter of the conductive cylinder 240 is fixed even when height of the conductive cylinder 240 is increased. Hence, distance of separation between neighboring cylindrical bonding structures 260 and hence neighboring bonding pads 114 (or bonding pads 216) on the chip 110 is shortened.

According to the first embodiment, the steps involved in fabricating the cylindrical bonding structure include forming a ball contact metallic layer globally over a wafer and then forming a patterned mask layer over the ball contact metallic layer. The mask layer has an opening that surrounds a bonding pad and exposes a portion of the ball contact metallic layer. An electroplating operation is conducted to partially fill the mask opening with conductive material, thereby forming a conductive cylinder. Another electroplating operation or printing operation is conducted to fill up the remaining space of the opening, thereby forming a cylindrical solder cap on the upper surface of the conductive cylinder. Finally, the mask layer and the ball contact metallic layer outside the conductive cylinder are removed to form the cylindrical bonding structure. Furthermore, a reflow operation may also be conducted to transform the cylindrical solder cap into a solder block having a hemispherical shape attached to the upper surface of the conductive cylinder.

In summary, the method of fabricating the cylindrical bonding structure according to the first embodiment of this invention mainly involves forming a conductive cylinder over the bonding pad of a chip. The conductive cylinder serves as a conductive medium as well as a pad for cushioning up the distance between the chip and the substrate. In addition, by attaching a solder block on the upper end of the conductive cylinder, the conductive cylinder and the junction pad on the substrate are bonded together after the solder block material is partially melted in a reflow operation. Hence, at the same height level, the conductive cylinder can be designed to have an outer diameter smaller than the outer diameter of a spherical bump in a conventional design. Ultimately, the distance of separation between neighboring cylindrical bonding structures and hence the corresponding distance of separation between neighboring bonding pads on the chip can be reduced.

Figure 3A:
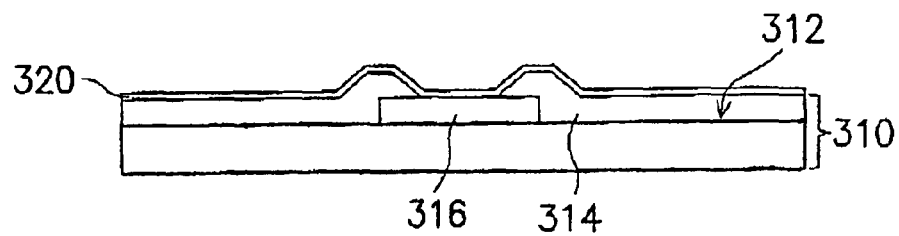
FIGS. 3A.about.3E are schematic cross-sectional views showing the progression of steps for producing a cylindrical bonding structure according to a second embodiment of this invention.
Figure 3B:
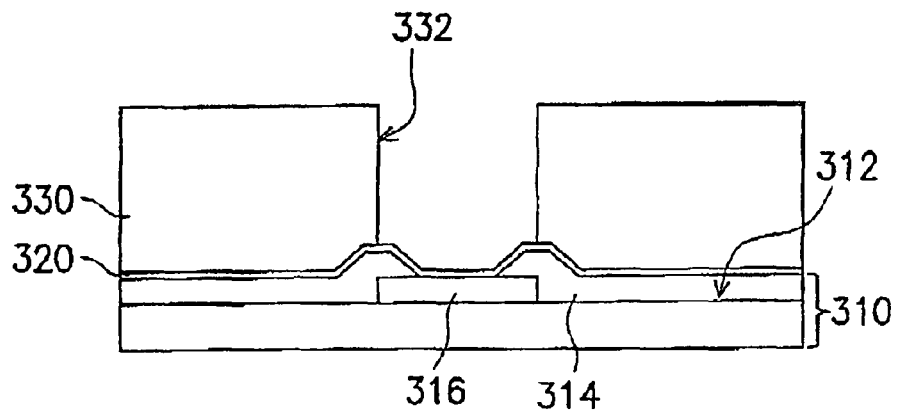
Figure 3C:
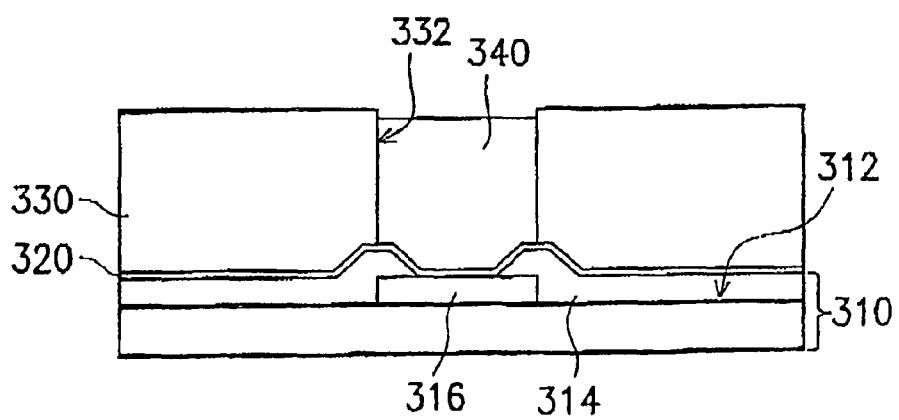

FIGS. 3A.about.3E are schematic cross-sectional views showing the progression of steps for producing a cylindrical bonding structure according to a second embodiment of this invention. The second embodiment differs from the first embodiment in that a solder ball is planted onto the upper surface of the conductive cylinder instead of forming the solder block (or the cylindrical solder cap). Since the initial steps as shown in FIGS. 3A.about.3C for forming the cylindrical bonding structure are identical to the ones shown in FIGS. 2A.about.2C, detailed description is omitted.

Figure 3D:
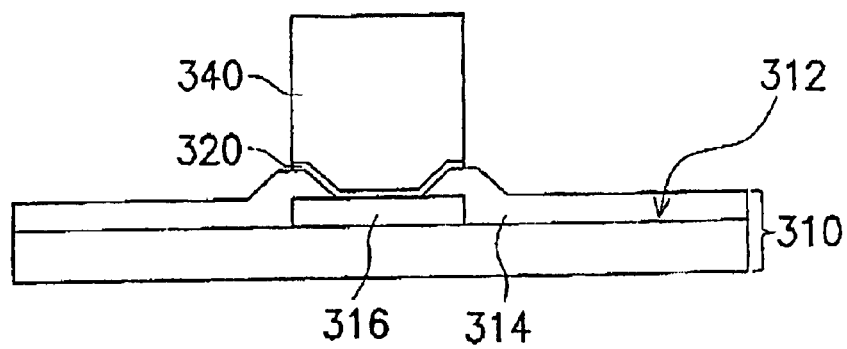
Figure 3E:
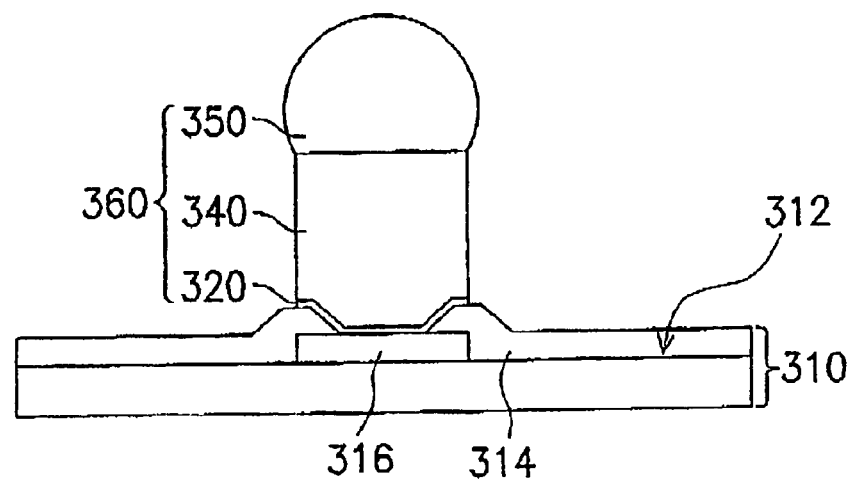

As shown in FIG. 3D, the mask layer 330 and the ball contact metallic layer 320 outside the conductive cylinder 340 are removed to expose the conductive cylinder 340. As shown in FIG. 3E, a ball placement operation is conducted to attach a solder ball 350 on the upper surface of the conductive cylinder 340. The solder ball 350 serves an identical function as the solder block 250a (or cylindrical solder cap 250) in the first embodiment. Hence, a cylindrical bonding structure 360 is formed on the bonding pad 314 of the chip 316.

In summary, one major aspect of both the first and the second embodiment of this invention is to form a block of solder material on top of a conductive cylinder for joining the conductive cylinder with junction pad on the substrate. The block of solder material may be shaped into a variety of forms including cylindrical, spherical or hemispherical The solder block is formed over the conductive cylinder by depositing solder material into the same opening for forming the conductive cylinder through conducting an electroplating operation or printing operation as in the first embodiment. Alternatively, a solder ball is planted on top of the conductive cylinder as in the second embodiment.

Figure 4A:
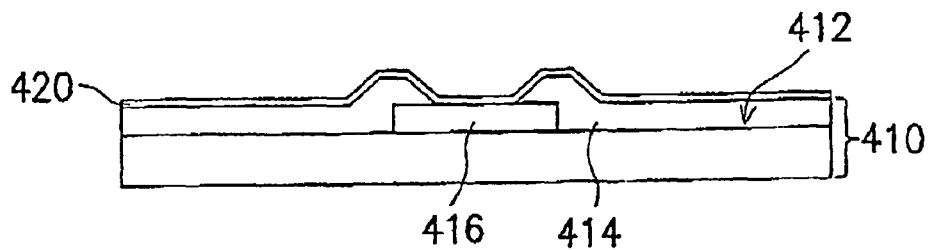
FIGS. 4A.about.4F are schematic cross-sectional views showing the progression of steps for producing a cylindrical bonding structure according to a third embodiment of this invention.

FIGS. 4A.about.4F are schematic cross-sectional views showing the progression of steps for producing a cylindrical bonding structure according to a third embodiment of this invention. One major aspect in the third embodiment that differs from the first and the second embodiment of this invention is the control of outer diameter and length of the solder block (or cylindrical solder cap) so that pitch between neighboring bonding pads on a chip can be further reduced.

As shown in FIG. 4A, a wafer 410 having an active surface 412 is provided. The active surface 412 has a plurality of bonding pads 416 thereon. A passivation layer covers the active surface 412 but exposes the bonding pads 416. A ball contact metallic layer 420 is formed over the entire active surface 412 (the passivation layer 414) of the wafer 410 including the bonding pads 416 by conducting an electroplating operation, evaporation plating operation or sputtering, for example.

Figure 4B:
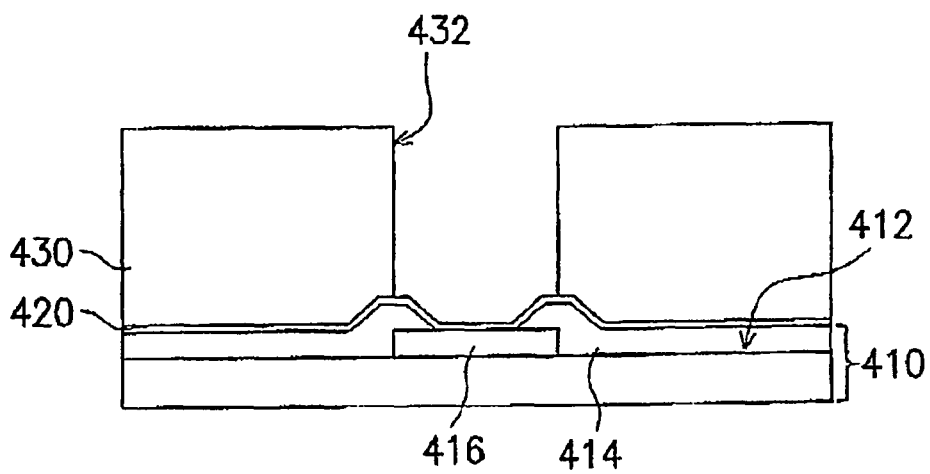

As shown in FIG. 4B, a first patterned mask layer 430 is formed over the ball contact metallic layer 420. The first mask layer 430 has a plurality of openings 432 that corresponds in position to the bonding pads 416 and exposes a portion of the ball contact metallic layer 420. Since the patterned first mask layer 430 is formed in a manner similar to the mask layer 230 in the first embodiment, description is not repeated here.

Figure 4C:
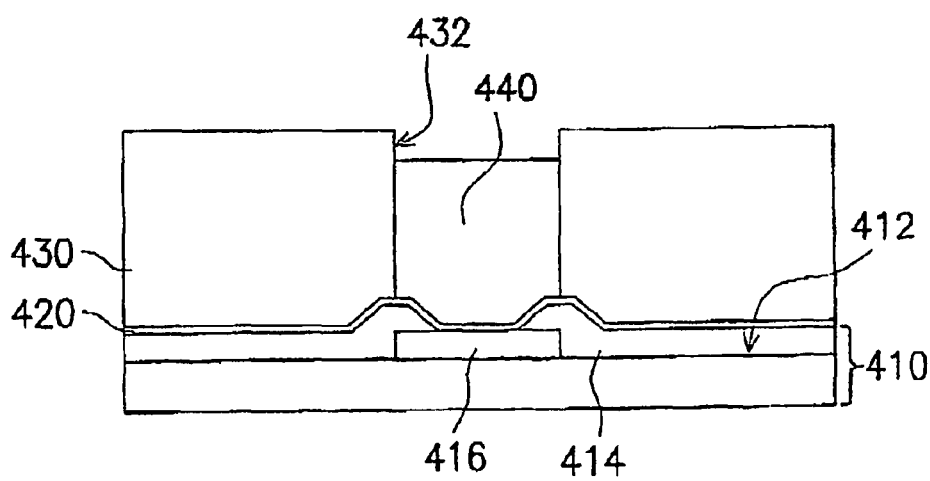

As shown in FIG. 4C, an electroplating operation is conducted to deposit conductive material into the openings 432 using the ball contact metallic layer 420 as a seed layer. Hence, conductive cylinders 440 are formed over the ball contact metallic layer 420. Note that the conductive material is a high melting point metal or alloy.

Figure 4D:
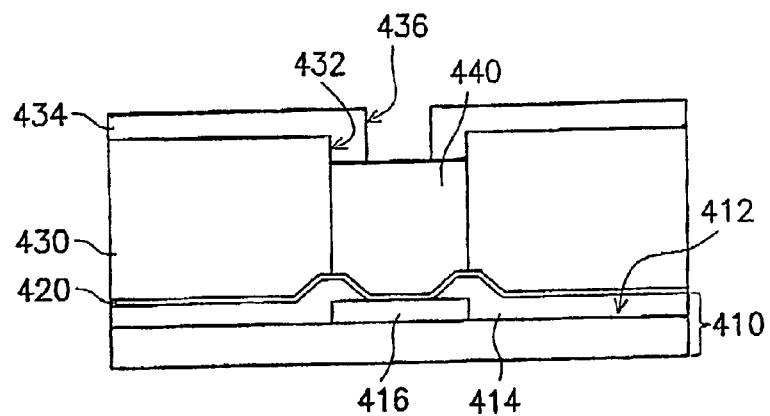

As shown in FIG. 4D, a second patterned mask layer 434 is formed over the first mask layer 430. The second mask layer 434 has a plurality of openings 436 and exposes the central region of the conductive cylinder 440. Since the patterned second mask layer 434 is formed in a manner similar to the mask layer 230 in the first embodiment, description is not repeated here.

Figure 4E:
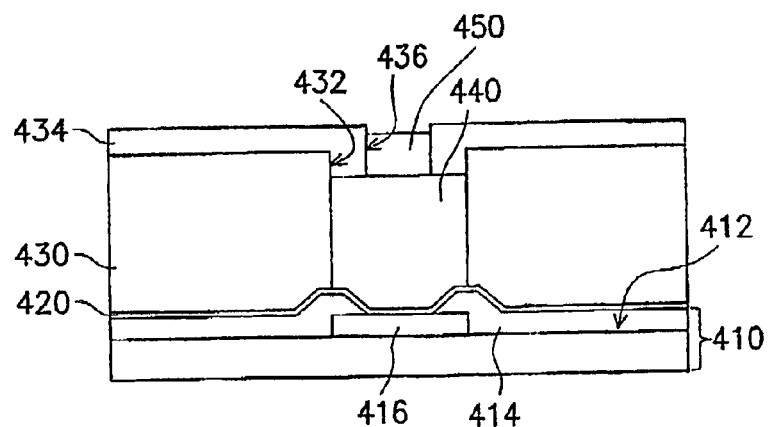

As shown in FIG. 4E, another electroplating operation is conducted to deposit conductive material into the openings 436 using the conductive cylinder 440 as a seeding layer. Hence, a cylindrical solder cap 450 is formed on the upper surface of each conductive cylinder 440. Note that the conductive material deposited into the openings 436 is a low melting point metal or alloy so that the cylindrical solder cap 450 has a melting point lower than the conductive cylinder 440.

Figure 4F:
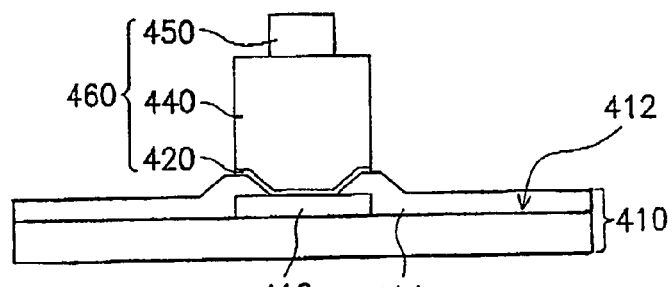

As shown in FIG. 4F, the first mask layer 430, the second mask layer 434 and the ball contact metallic layer 420 outside the conductive cylinder 440 are removed. The remaining ball contact metallic layer, the conductive cylinder 440 and the cylindrical solder cap 450 together form a cylindrical bonding structure 460.

Figure 5A:
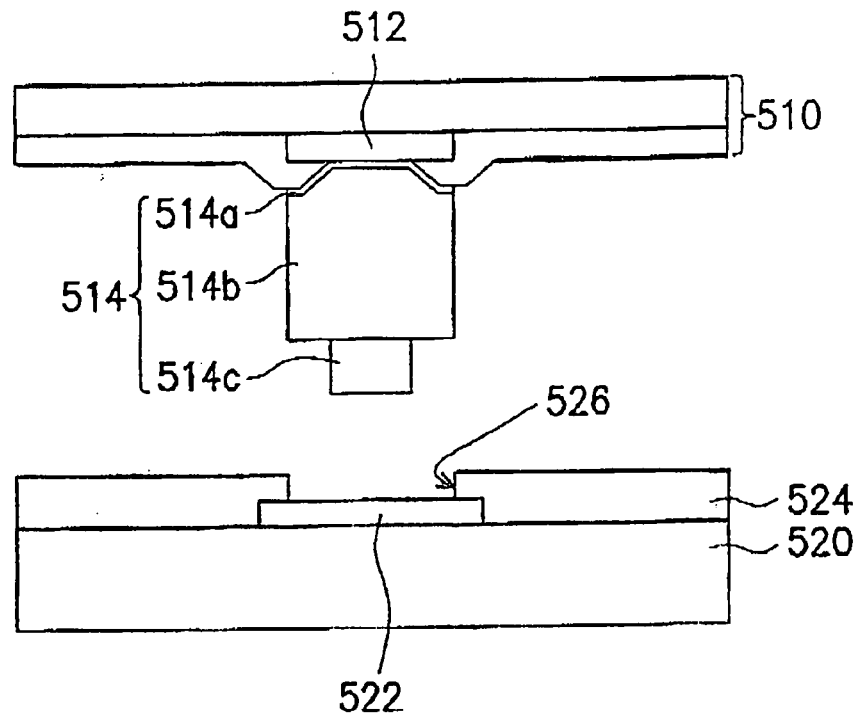
FIGS. 5A.about.5C are schematic cross-sectional views showing an application of the third cylindrical bonding structure according to this invention to the fabrication of a flip-chip package.

FIGS. 5A.about.5C are schematic cross-sectional views showing an application of the third cylindrical bonding structure according to this invention to the fabrication of a flip-chip package. As shown in FIG. 5A, a cylindrical bonding structure 514 according to the third embodiment of this invention is formed on the bonding pad 512 of a chip 510. The cylindrical bonding structure 514 comprises a ball contact metallic layer 514a, a conductive cylinder 514b and a cylindrical solder cap 514c. In addition, a substrate 520 having a solder mask layer 524 and a junction pad 522 thereon is also provided. The solder mask 524 has a plurality of openings 526 that exposes the junction pads 522.

Figure 5B:
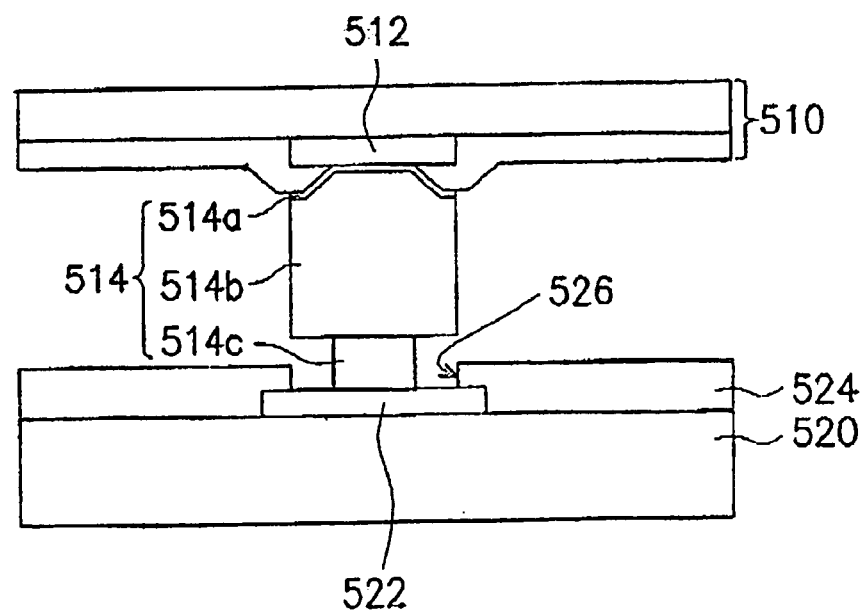

As shown in FIG. 5B, the cylindrical solder cap 514c has an outer diameter smaller than the diameter of the opening 526 on the solder mask 524. Hence, tolerance between the cylindrical solder cap 514c on the cylindrical bonding structure 514 and the junction pad 522 on the substrate 520 is greatly increased. Furthermore, if the conductive cylinder 514b has an outer diameter greater than the diameter of the opening 526, the cylindrical solder cap 514c must be designed to have a length greater than the depth of the opening 526. Hence, when the cylindrical solder cap 514c is lowered into the opening 526, the upper end of the cylindrical solder cap 514c is able to contact the junction pad 522.

Figure 5C:
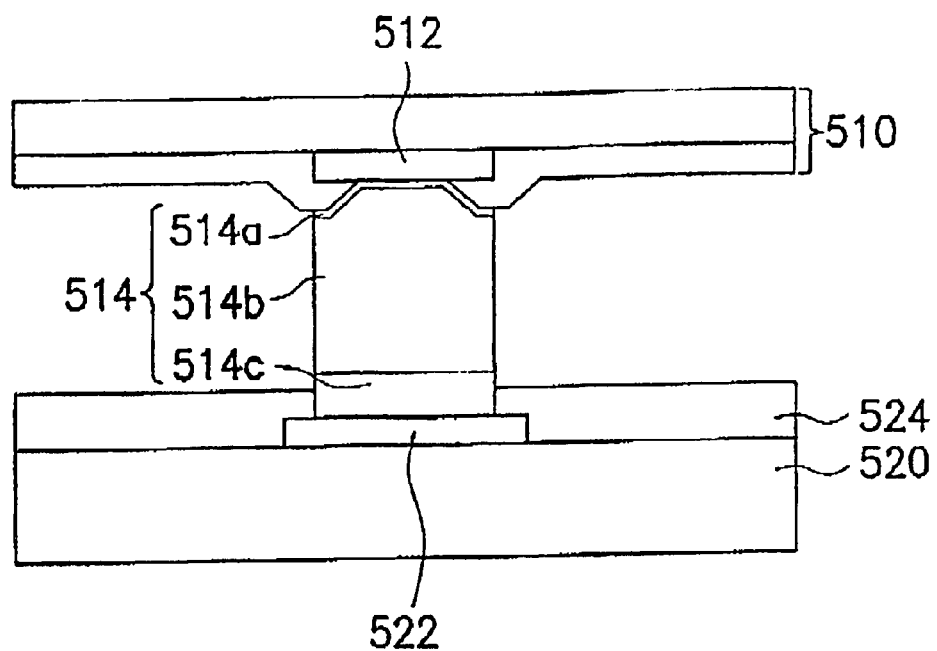

As shown in FIG. 5C, a reflow process may be conducted after the upper surface of the cylindrical solder cap 514c is positioned to contact the junction pad 522. In the reflow process, the cylindrical solder cap 514c partially melts and joins together the conductive cylinder 514b and the junction pad 522. Moreover, an under fill material may be injected into the space between the chip 510 and the substrate 520 to protect the cylindrical bonding structure 514 and serve as a vibration damper.

The method of fabricating the cylindrical bonding structure according to the third embodiment includes forming a ball contact metallic layer over the surface of a wafer surface and forming a patterned first mask layer over the ball contact metallic layer. The first mask layer has openings that correspond in position to various bonding pads on the wafer and exposes a portion of the ball contact metallic layer An electroplating operation is conducted to deposit conductive material into the openings of the first mask layer to form conductive cylinders. A patterned second mask layer is formed over the first mask layer. The second mask layer has openings that expose a portion of the upper surface of the conductive cylinders. Similarly, solder material is deposited into the openings of the second mask by conducting an electroplating operation to form cylindrical solder caps over the conductive cylinders. The first mask layer, the second mask layer and the ball contact metallic layer outside the conductive cylinder are removed so that the remaining ball contact metallic layer, the conductive cylinder and the cylindrical solder cap together form a cylindrical bonding structure on the chip.

One major difference between the cylindrical bonding structure according to the third embodiment and the first two embodiments is that the cylindrical solder cap is designed to have an outer diameter smaller than opening diameter on the solder mask. Hence, the cylindrical solder cap may easily lower into the opening to contact the junction pad on the substrate. This increases the yield of fabricating a flip-chip package and reduces the diameter of the opening. Ultimately, distance of separation between neighboring junction pads on a substrate and distance of separation between neighboring bonding pads on a chip may both be reduced.

Figure 6A:
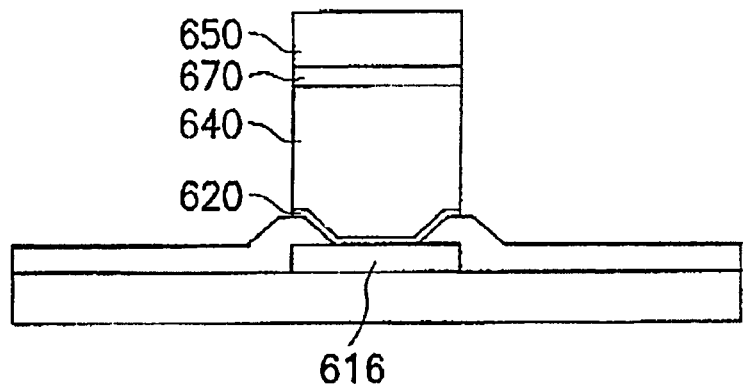
FIGS. 6A.about.6E are cross-sectional views showing cylindrical bonding structures fabricated according to this invention with each cylindrical bonding structure having an addition transition layer between the conductive cylinder and the solder cap.

FIGS. 6A.about.6E are cross-sectional views showing cylindrical bonding structures fabricated according to this invention with each cylindrical bonding structure having an additional transition layer between the conductive cylinder and the solder cap. As shown in FIGS. 6A.about.6E, a transition layer 670 is inserted between the conductive cylinder 640 and the solder block 650 in each case. The transition layer 670 may provide different functions according to the constituent materials. Furthermore, the transition layer 670 can be a single layer or a multiple of layers. In FIG. 6A, the transition layer 670 provides a function very similar to the ball contact metallic layer 620 between the bonding pad 616 and the conductive cylinder 640. The transition layer 670 may contain one or a more layers. The transition layer mainly boosts the connectivity between the conductive cylinder 640 and the solder block 650 or prevents the collapse of solder block 650 material onto the peripheral section of the conductive cylinder 640 after conducting a reflow operation leading to a short-circuit between neighboring conductive cylinders.

Figure 6B:
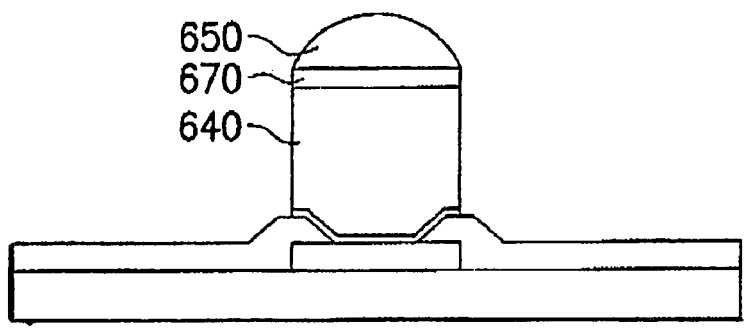
Figure 6C:
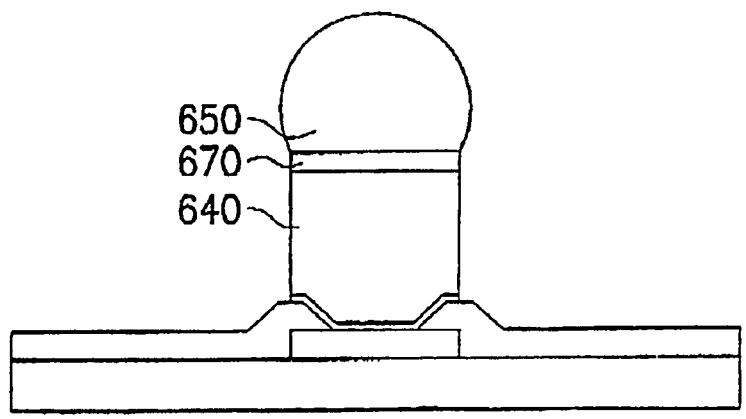
Figure 6D:
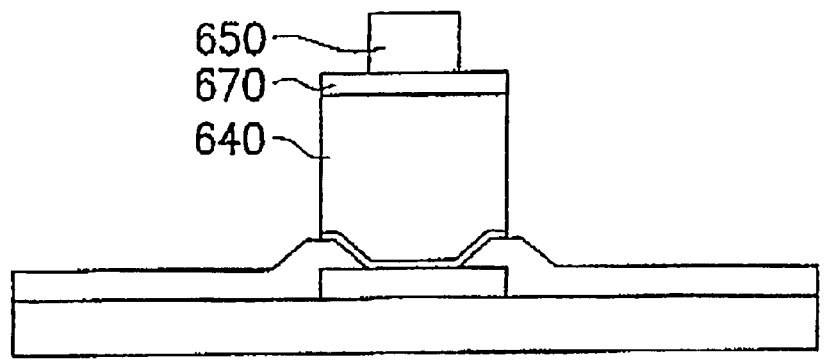
Figure 6E:
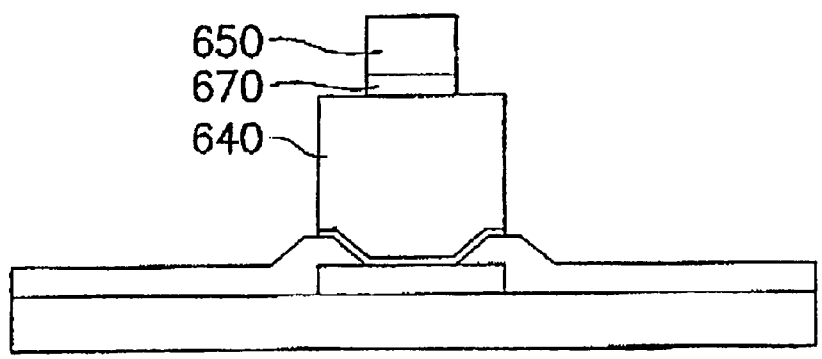

The transition layer 670 is fabricated after forming the conductive cylinder 640. The transition layer 670 is formed over the upper surface of the conductive cylinder 640. Thereafter, a cylindrical solder cap 650 is formed over the transition layer 670 in FIG. 6A, while a solder block having a hemispherical shape is formed over the transition layer 670 in FIG. 6B. In FIG. 6C, the transition layer 670 is also fabricated on the upper surface of the conductive cylinder 640 after forming the conductive cylinder 640. However, a solder ball 650 is attached to the transition layer 670 instead of a solder cap. Similarly, in FIGS. 6D and 6E, the transition layer 670 is fabricated on the upper surface of the conductive cylinder before forming a solder cap over the transition layer 670. One major difference is that the transition layer 670 in FIG. 6D is formed inside the opening of the patterned first mask layer 430 (in FIG. 4C) while the transition layer 670 in FIG. 6E is formed inside the opening of the patterned second mask layer 434 (in FIG. 4D).

In conclusion, the cylindrical bonding structure according to this invention is formed by constructing a conductive cylinder over the bonding pad of a chip and using the conductive cylinder to cushion up the distance of separation between the chip and a substrate. The solder block on the tip of the conductive cylinder is also used to join the conductive cylinder to a junction pad on the substrate. Compared with a conventional design using spherical bumps, the cylindrical bonding structure can provide a smaller contact separation. In addition, the solder block may have a variety of profiles including cylindrical, spherical or hemispherical shape. Note that when the solder block has a cylindrical shape, the length and outer diameter of the cylinder may be adjusted to fit into the opening leading to the junction pad. Consequently, outer diameter of the opening may be reduced and separation between neighboring junction pads may be reduced. In other words, separation of neighboring bonding pads on a chip may be reduced.

Because the conductive cylinder and the junction pad are connected by partially melting the solder block in a reflow process, the step of applying a low melting point solder material on the junction pads of the substrate or the surface of bumps in a conventional design can be eliminated. Hence, production cost of the flip-chip package is reduced.

Furthermore, the conventional high-temperature reflow process for shaping the bumps into a spherical shape may result in the formation of excessive oxide material on bump surface and may lead to poor bonding between the bump and the junction pad. In this invention, however, the solder block is formed on the upper surface of the conductive cylinder. A high-temperature reflow process for shaping the solder block into a spherical form is not absolutely required. Even if a spherical shape is demanded, the solder block is shaped using a low-temperature reflow process. Hence, not much oxidation occurs at the surface of the solder block material. Ultimately, a better junction structure is formed linking up the conductive cylinder and the junction pad.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package comprising:
a substrate comprising a first pad having a first surface with a first region, a second region and a third region between said first and second regions, and a solder mask layer on said substrate and on said first and second regions, wherein an opening defined by sidewalls of said solder mask layer exposes said third region, wherein said solder mask layer has a surface opposite from the substrate;
a chip opposite said substrate, wherein said chip comprises a second pad aligned with said third region, wherein said surface of said solder mask layer faces said chip;
a copper pillar having a first surface on said second pad and a second surface opposite said first surface and between said third region and said copper pillar;
a tin-containing cap between said copper pillar and said third region, wherein said tin-containing cap comprises a first surface in said opening and directly on said third region of said first pad, and a second surface opposite said first surface of said tin-containing cap and only on said second surface of said copper pillar, said tin-containing cap extending beyond said surface of said solder mask layer, wherein said tin-containing cap has a thickness less than that of said copper pillar and greater than a depth of said opening, wherein said tin-containing layer has a width less than a width of said opening, wherein said first pad has a sidewall with a portion not covered by said tin-containing cap but covered by said solder mask layer;
a conductive layer between said copper pillar and said tin-containing layer, in which a diameter of each of said tin-containing cap and said conductive layer is less than a diameter of said copper pillar, and a diameter of said opening defines gaps between sidewalls of said conductive layer, sidewalls of said copper pillar and said sidewalls of said solder mask layer; and
an underfill between said chip and said substrate.

2. The chip package of claim 1, wherein said tin-containing cap comprises silver.

3. The chip package of claim 1, wherein said copper pillar is electroplated.

4. The chip package of claim 1 further comprising a titanium-containing layer between said copper pillar and said second pad.

5. The chip package of claim 1 further comprising a titanium-tungsten-alloy layer between said copper pillar and said second pad.

6. The chip package of claim 1, wherein said tin-containing cap contacts said copper pillar.

7. A chip package comprising:
a substrate comprising a first pad having a top surface with a first region, a second region and a third region between said first and second regions, and a solder mask layer on said first and second regions, wherein an opening in said solder mask layer is over said third region;
a chip over said substrate, wherein said chip comprises a second pad vertically over said first pad;
a copper pillar between said third region and said second pad, wherein said copper pillar has a thickness greater than a depth of said opening, wherein a vertical distance between said copper pillar and said third region is greater than said depth of said opening;
a tin-and-gold-containing layer between said copper pillar and said third region, wherein said tin-and-gold-containing layer has a thickness less than said thickness of said copper pillar; and
an underfill between said chip and said substrate.

8. The chip package of claim 7, wherein said tin-and-gold-containing layer comprises silver.

9. The chip package of claim 7, wherein said tin-and-gold-containing layer comprises copper.

10. The chip package of claim 7, wherein said copper pillar is electroplated.

11. The chip package of claim 7 further comprising a titanium-containing layer between said copper pillar and said second pad.

12. The chip package of claim 7 further comprising a titanium-tungsten-alloy layer between said copper pillar and said second pad.

13. The chip package of claim 7 further comprising a conductive layer between said copper pillar and said tin-and-gold-containing layer.

14. The chip package of claim 7, wherein said tin-and-gold-containing layer contacts said copper pillar.

15. A chip package comprising:
a substrate comprising a first pad having a first surface with a first region, a second region and a third region between said first and second regions, and a solder mask layer on said substrate and on said first and second regions, wherein an opening defined by sidewalls of said solder mask layer exposes said third region, wherein said solder mask layer has a surface;
a chip opposite said substrate, wherein said chip comprises a second pad aligned with said third region, wherein said surface of said solder mask layer faces said chip;
a copper pillar having a first surface on said second pad and a second surface opposite said first surface and between said third region and said copper pillar;
a tin-containing cap between said copper pillar and said third region, wherein said tin-containing cap comprises a first surface in said opening and directly on said third region of said first pad, and a second surface opposite said first surface of said tin-containing cap and only on said second surface of said copper pillar, said tin-containing cap extending beyond said surface of said solder mask layer, wherein said tin-containing cap has a thickness less than a thickness of said copper pillar and greater than a depth of said opening, wherein said tin-containing cap has a width less than a width of said opening, wherein said first pad has a sidewall with a portion not covered by said tin-containing cap but covered by said solder mask layer;
a conductive layer between said copper pillar and said tin-containing layer, in which a diameter of each of said tin-containing cap and said conductive layer is less than a diameter of said copper pillar, and a diameter of said opening defines gaps between sidewalls of said conductive layer, sidewalls of said copper pillar and said sidewalls of said solder mask layer; and
an underfill between said chip and said substrate.

16. The chip package of claim 15, wherein said tin-containing cap comprises silver.

17. The chip package of claim 15, wherein said tin-containing cap comprises lead.

18. The chip package of claim 15 further comprising a titanium-containing layer between said copper pillar and said second pad.

19. The chip package of claim 15 further comprising a titanium-tungsten-alloy layer between said copper pillar and said second pad.

20. The chip package of claim 15, wherein said copper pillar is electroplated.

* * * * *